(12) United States Patent
Lu et al.

(10) Patent No.: US 11,588,493 B2
(45) Date of Patent: Feb. 21, 2023

(54) CIRCUITRY AND METHOD FOR REDUCING ENVIRONMENTAL NOISE

(71) Applicant: TAIWAN SEMICONDUCTOR MANUFACTURING COMPANY LTD., Hsinchu (TW)

(72) Inventors: Chung-Ting Lu, Kaohsiung (TW); Chih-Chiang Chang, Taipei (TW); Chung-Chieh Yang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/333,634

(22) Filed: May 28, 2021

(65) Prior Publication Data
US 2022/0393695 A1  Dec. 8, 2022

(51) Int. Cl.
*H03M 1/08* (2006.01)
*H03M 1/10* (2006.01)
*H03K 5/24* (2006.01)

(52) U.S. Cl.
CPC ............... *H03M 1/08* (2013.01); *H03K 5/24* (2013.01); *H03M 1/1071* (2013.01)

(58) Field of Classification Search
CPC ........ H03K 5/2481; H03K 5/249; H03K 5/24; H03K 5/2418; G01R 19/0038
USPC .......................................................... 327/63
See application file for complete search history.

(56) References Cited

U.S. PATENT DOCUMENTS

| | | | | |
|---|---|---|---|---|
| 4,618,818 A * | 10/1986 | Horn | ...................... | G01R 17/00 324/706 |
| 9,476,772 B2 * | 10/2016 | Lane | ....................... | G01J 5/046 |
| 9,909,944 B2 * | 3/2018 | Matzen | ................. | G01L 9/0055 |
| 2008/0034145 A1 * | 2/2008 | Hao | ......................... | G11C 7/24 710/307 |
| 2014/0375135 A1 * | 12/2014 | Nervegna | .......... | G01R 27/2605 307/86 |

* cited by examiner

*Primary Examiner* — Quan Tra
(74) *Attorney, Agent, or Firm* — WPAT Law; Anthony King

(57) ABSTRACT

The present disclosure provides a circuitry. The circuitry includes a comparator and a signal correlated circuit. The comparator includes a first input terminal, a second input terminal, and an output terminal. The signal correlated circuit includes a first input terminal, a second input terminal, a first output terminal, and a second output terminal. The first input terminal is coupled to receive a first input signal. The second input terminal is coupled to receive a second input signal independent from the first input signal. The first output terminal is configured to generate a first output signal and to send the first output signal to the first input terminal of the comparator. The second output terminal is configured to generate a second output signal and to send the second output signal to the second input terminal of the comparator. The first output signal and the second output signal are correlated.

20 Claims, 5 Drawing Sheets

US 11,588,493 B2

CIRCUITRY AND METHOD FOR REDUCING ENVIRONMENTAL NOISE

BACKGROUND

Dynamic comparators play an important role in mixed-signal circuits, especially in analog-to-digital converters (ADCs). With the advancement of high precision and low voltage sensors, the required resolution of ADCs increases as well. As a result, the voltage step of a Least Significant Bit (LSB) of ADCs may fall below micro-voltage level. The input referred noise of a comparator may not be ignored in such precision ADCs and precise noise measurement is required in circuit design.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1A:
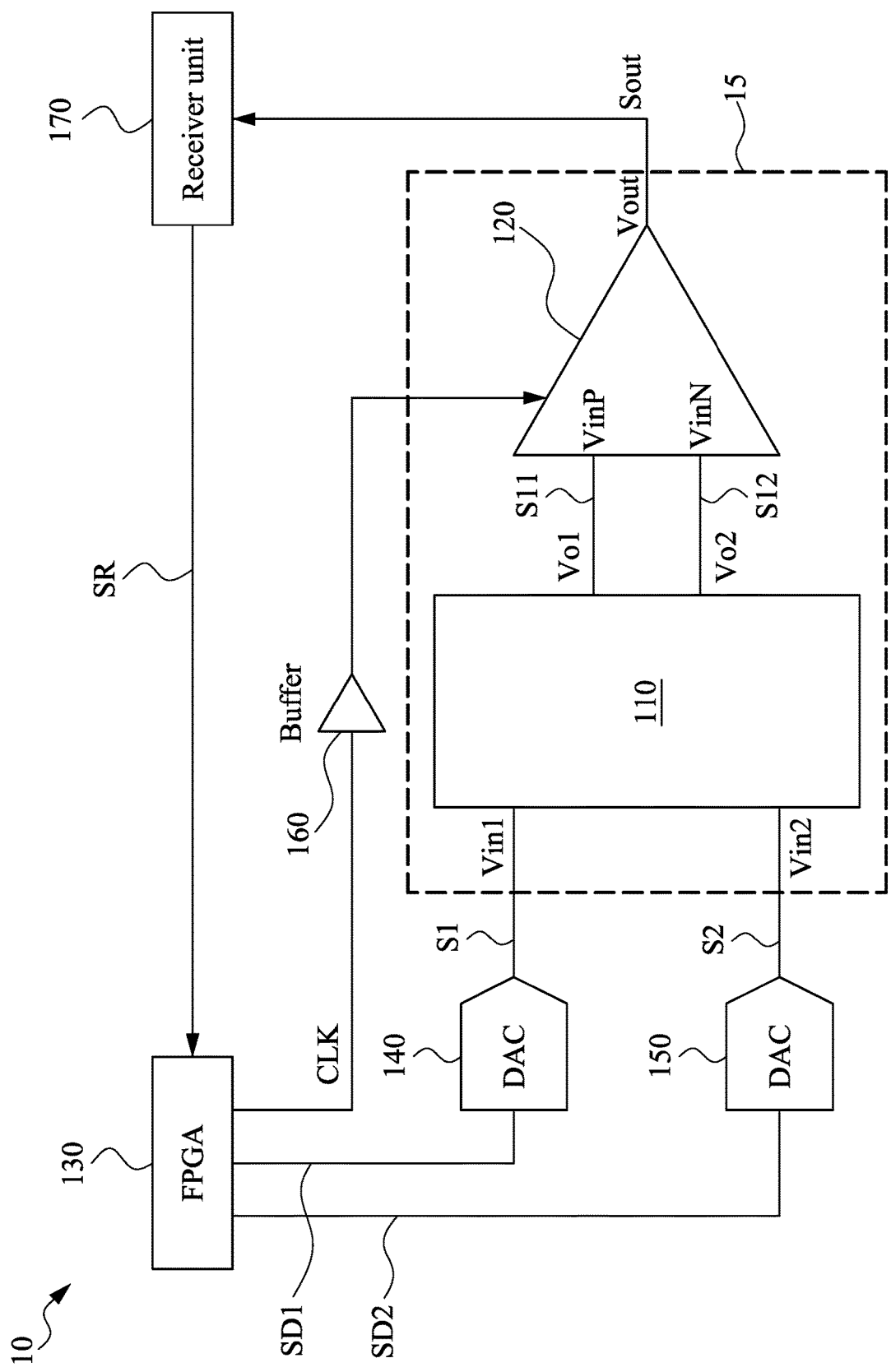
FIG. 1A is a diagram illustrating a system for measuring noise of a comparator in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In the below description, a signal is asserted with a logic high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

With the development of high precision and low voltage sensors, precise noise measurement is required in order to achieve the high resolution of ADCs. Therefore, a circuit, system, and method for reducing environmental noise with complex design is proposed, which conserves cost and area as well.

FIG. 1A is a diagram illustrating an exemplary system 10 for measuring noise of a comparator in accordance with some embodiments of the present disclosure. The exemplary system 10 may be included in an ADC or any other circuits requiring a high-resolution comparator. The exemplary system 10 may be a built-in self-test (BIST) circuit disposed on a die including an ADC for measuring noise of the comparator 120. The ADC may include a BIST circuit to dynamically confirm the performance of the comparator. In some embodiments, the system 10 includes a signal correlated unit 110, a comparator 120, a field programmable gate array (FPGA) board 130, digital-to-analog converters (DACs) 140 and 150, a buffer 160, and a receiver unit 170. The signal correlated unit 110 and the comparator 120 may be included in a system 15.

In some embodiments, the FPGA board 130 may be an integrated circuit. The FPGA board 130 may have functions of clocking, generating signals, memory, etc. The FPGA board 130 may generate digital signal SD1 and transmit the digital signal SD1 to the DAC 140. The FPGA board 130 may generate digital signal SD2 and transmit the digital signal SD2 to the DAC 150.

The DAC 140 may convert the digital signal SD1 to analog signal S1 and transmit the analog signal S1 to the signal correlated unit 110. The DAC 150 may convert the digital signal SD2 to analog signal S2 and transmit the analog signal S2 to the signal correlated unit 110. The DAC 140 transmits the analog signal S1 to the input terminal Vin1 of the signal correlated unit 110. The DAC 150 transmits the analog signal S2 to the input terminal Vin2 of the signal correlated unit 110. In response to the analog signals S1 and S2 received from the DACs 140 and 150, the signal correlated unit 110 may generate output signals S11 and S12 through the output terminals Vo1 and Vo2. In some embodiments, the output signal S11 at the output terminal Vo1 corresponds to the analog signals S1 and S2 received at the input terminals Vin1 and Vin2. In some embodiments, the output signals S12 at the output terminal Vo2 corresponds to the analog signals S1 and S2 received at the input terminals Vin1 and Vin2. The signal correlated unit 110 is configured to generate the output signals S1 and S12 to the comparator 120. For example, the output signal S11 generated at the output terminal Vo1 is inputted to the input terminal VinP of the comparator 120. The output signal S12 generated at the output terminal Vo2 is inputted to the input terminal VinN of the comparator 120.

The comparator 120 may determine the difference of voltage level (or current level) between the input terminal VinP and the input terminal VinN and generate an output voltage Sout at the output terminal Vout of the comparator 120 in response to the signals S11 and S12 received at the input terminals VinP and VinN. For example, the comparator 120 may provide a logic high output signal (e.g., a signal with a logical value "1" or a signal having a high logical value) if the signal S11 at the input terminal VinP has a voltage higher than a voltage of the signal S12 at the input terminal VinN. On the contrary, the comparator 120 may provide a logic low output signal (e.g., a signal with a logical value "0" or a signal having a low logical value) if the signal S11 at the input terminal VinP has a voltage lower than a voltage of the signal S12 at the input terminal VinN. The output signal Sout at the output terminal Vout of the comparator 120 may be transmitted to the receiver unit 170.

The receiver unit 170 may receive the signal Sout from the output terminal Vout of the comparator 120 and generate a signal SR in response to the signal Sout received from the output terminal Vout of the comparator 120. For example, the signal SR generated by the receiver unit 170 may be a boosted or bucked signal depending on the logical value of the signal Sout received from the output terminal Vout of the comparator 120.

The signal SR generated from the receiver unit 170 is transmitted to the FPGA board 130. Accordingly, the FPGA board 130 can adjust its output signals SD1 and SD2 to the DACs 140 and 150 based on the signal SR received from the receiver unit 170.

In some embodiments, the comparator 120 may be or include a dynamic comparator.

In some embodiments, the comparator 120 may be or include a differential comparator. In some embodiments, the comparator 120 may be or include an operational amplifier (op-amp) voltage comparator. The comparator 120 may receive a clock signal CLK to start comparing the input signals S11 and S12 received at the input terminals VinP and VinN. The clock signal CLK may be generated by the FPGA board 130 and transmitted to the comparator 120. In some embodiments, the clock signal CLK may be transmitted to the comparator 120 through a buffer 160. The buffer 160 may output a signal having a logic level identical to the clock signal CLK. In some embodiments, the output signal of the buffer 160 may be boosted without changing the logic level.

Figure 1B:
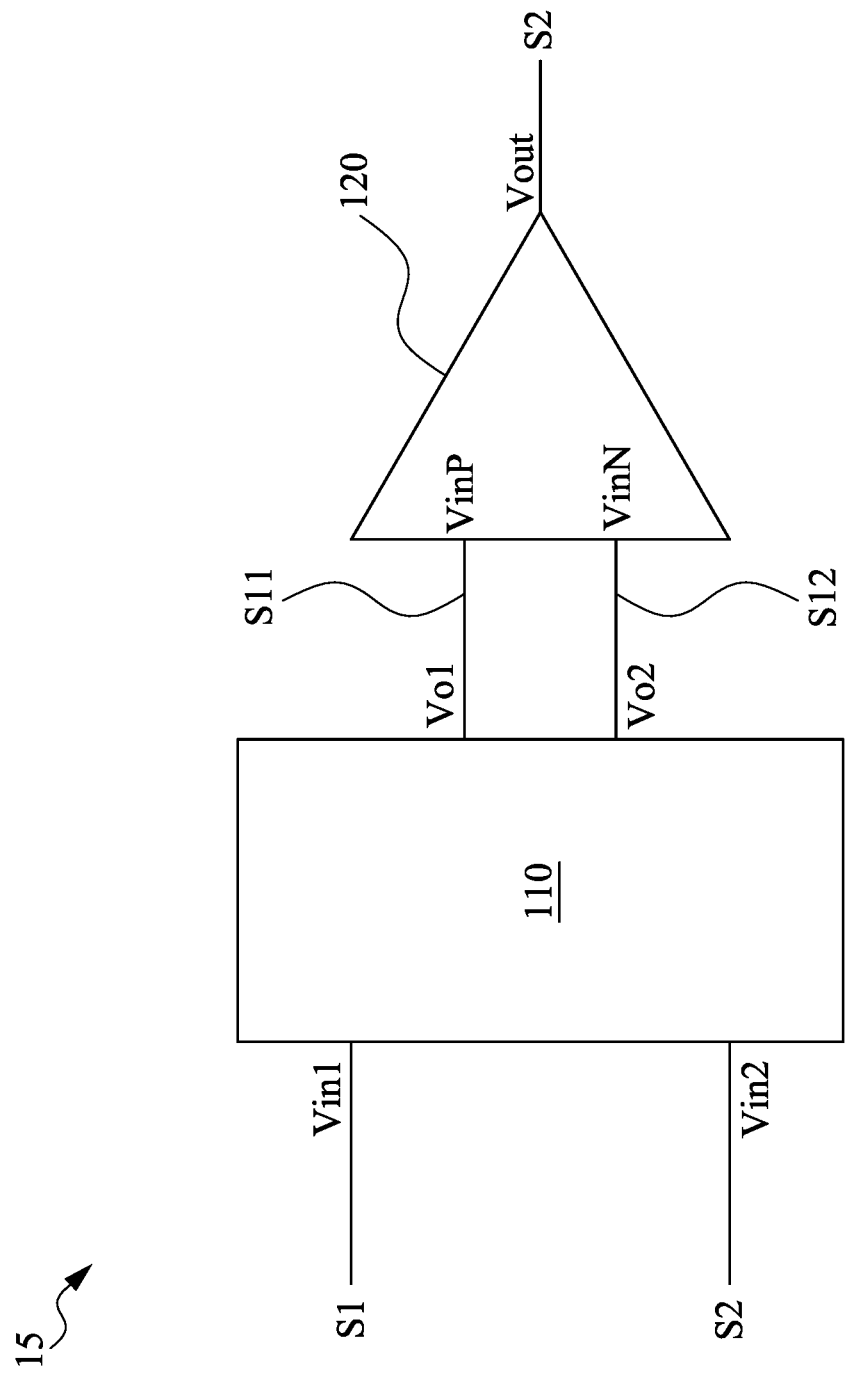
FIG. 1B is a diagram illustrating a system for reducing the noise of the comparator in accordance with some embodiments of the present disclosure.

FIG. 1B is a diagram illustrating an exemplary system 15 for reducing the noise of the comparator in accordance with some embodiments of the present disclosure. In some embodiments, the system 15 may be included in a BIST circuit, an ADC, or any circuit including comparators. As shown in FIG. 1B, the system 15 includes the signal correlated unit 110 and the comparator 120. The comparator 120 has input terminals VinP and VinN, and an output terminal Vout. The signal correlated unit 110 has input terminals Vin1 and Vin2, and output terminals Vo1 and Vo2.

In some embodiments, the input terminal Vin1 may be coupled to receive an input signal S1. The input terminal Vin2 may be coupled to receive an input signal S2. The output terminal Vo1 may be coupled to the input terminal VinP of the comparator 120. The output terminal Vo2 may be coupled to the input terminal VinN of the comparator 120.

In some embodiments, the input signal S1 may be applied to the input terminal Vin1 of the signal correlated unit 110. The input signal S2 may be applied to the input terminal Vin2 of the signal correlated unit 110. In some embodiments, the input signal S1 is independent from the input signal S2. In response to the input signals S1 and S2, the signal correlated unit 110 may generate an output signal S11 and an output signal S12. In some embodiments, the output signal S11 may be transmitted from the output terminal Vo1 to the input terminal VinP of the comparator 120. The output signal S12 may be transmitted from the output terminal Vo2 to the input terminal VinN of the comparator 120.

In some embodiments, the output signal S11 is correlated with the input signals S1 and S2. For example, the output signal S11 can be generated based on both the input signals S1 and S2. In some embodiments, the output signal S12 is correlated with the input signals S1 and S2. For example, the output signal S12 can be generated based on both the input signals S1 and S2. The output signal S11 may be different from the output signal S12.

The comparator 120 receives the signal S11 generated by the signal correlated unit 110 at the input terminal VinP. The comparator 120 receives the output signal S12 generated by the signal correlated unit 110 at the input signal terminal VinN. The comparator 120 determines a difference of voltage level (or current level) between the signals S11 and S12 and generate an output signal Sout at the output terminal Vout in response to the signals S11 and S12 received at the input terminals VinP and VinN. If the difference is positive (e.g., the voltage of the signal S1 is higher than that of the signal S12), the comparator 120 may output a logic high output signal at the output terminal Vout of the comparator 120. When the difference is negative (e.g., the voltage of the signal S11 is lower than that of the signal S12), the comparator 120 may output a logic low output signal at the output terminal Vout of the comparator 120.

The input signals S1 and S2 may include independent environmental noise. When the resolution of the comparator increases, the comparator may be impacted and generate inaccurate output signals caused by the environmental noise. The environmental noise may be caused by inductive coupling or capacitive coupling of the devices, or through the antenna of a radio receiver. With the advanced resolution of comparators, the environmental noise may not be ignored. In some embodiments, the resolution of the comparator may be micro-voltage level (e.g., 1 mV or less), and thus the environmental noise should be lower than the resolution of the comparator. In general, the environmental noise may be controlled under the resolution of the comparator. If signals inputted to input terminals of a comparator are independent from each other, environmental noise of the signals may not be eliminated or reduced, which would have an adversely impact on the comparator.

In accordance with the embodiments as shown in FIGS. 1A and 1B, since the output signals S11 and S12 are correlated (e.g., each of the signals S11 and S12 corresponds to the input signals S1 and S2), the noise (e.g., environmental noise) of the output signals S11 and S12 may correspondingly exhibit correlation. With the correlation between the output signals S11 and S12, noise may be filtered out or reduced through the comparator 120.

In some embodiments, the output noise $\sigma_{Sout}$ of the system 15 may be the input-referred noise defined by the input noise of the system 15. The output noise $Q_{Sout}$ may represent the output noise of the output signal Sout of the comparator 120, which could be calculated with Formula 1:

$$\sigma_{Sout}^2 = g_m * [(\sigma_{s1}^2 + \sigma_{s2}^2) - 2 \operatorname{cov}(s1, s2)] \qquad [\text{Formula 1}],$$

in which $\sigma_{s1}$ represents the noise of the input signal S1; $\sigma_{s2}$ represents the noise of the input signal S2; $g_m$ represents the transconductance of the signal correlated unit 110; cov(s1, s2) represents a covariance between signals S1 and S2.

The covariance is a measurement of the joint variability of two random signals. If the signals tend to show a similar trend, the covariance will be positive. On the contrary, the signals tend to show an opposite trend, the covariance is negative. In some embodiments, the covariance cov(s1,s2) may be positive since the signals S11 and S12 generated in response to the input signals S1 and S2 are correlated.

In some embodiments, the noise of the signals S1 and S2 may be completely removed by the comparator 120 when the noise of the signals S11 and S12 are strongly correlated.

With strong correlation between the output signals S11 and S12, the comparator 120 may remove the input-referred noise by a differential comparing. When the output signals S11 and S12 are strong correlated in response to the input signals S1 and S2, the noise of the input signals S1 and S2 may be substantially identical with the covariance, which could be calculated with Formula2:

$$(\sigma_{s1}^2 + \sigma_{s2}^2) \cong 2 \operatorname{cov}(s1, s2) \qquad [\text{Formula 2}].$$

Applying the Formula 2 to Formula 1, Formula 1 may be derived as:

$$\sigma_{Sout}^2 = g_m * [(\sigma_{s1}^2 + \sigma_{s2}^2) - 2 \operatorname{cov}(s1, s2)] \cong 0.$$

Accordingly, the comparator 120 may remove the input-referred noise by a differential comparison, when there is a strong correlation between the output signals S11 and S12.

Figure 2:
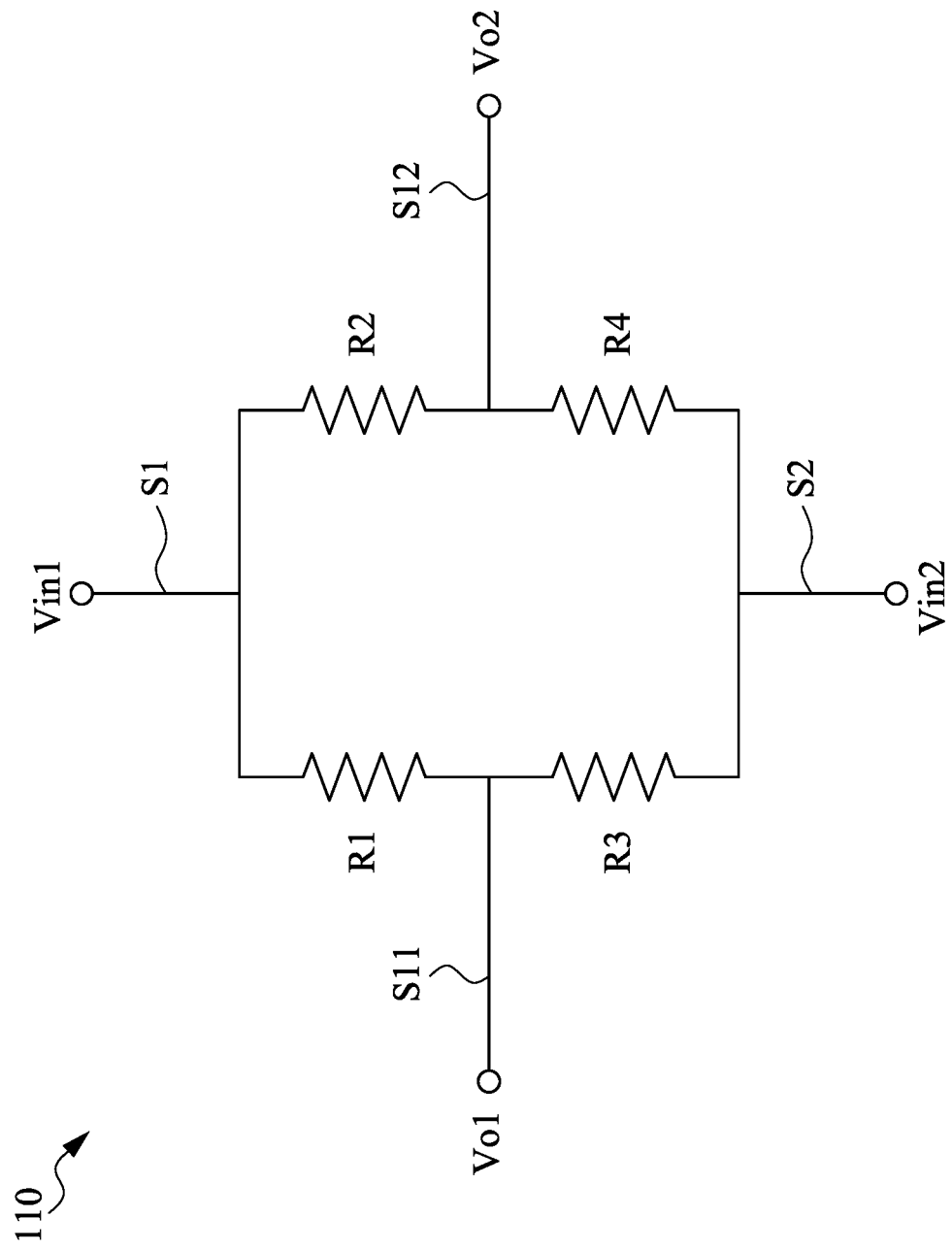
FIG. 2 is a block diagram of the signal correlated unit in accordance with some embodiments of the present disclosure.

FIG. 2 is a block diagram of the signal correlated unit 110 shown in FIGS. 1A and 1B in accordance with some embodiments of the present disclosure. In some embodiments, the signal correlated unit 110 may be a signal correlated circuit. As shown in FIG. 2, the signal correlated unit 110 may include an input terminal Vin1, an input terminal Vin2, an output terminal Vo1, and an output terminal Vo2 corresponding to the terminals shown in FIGS. 1A and 1B. In some embodiments, the signal correlated unit 110 may include a plurality of resistors R1, R2, R3, and R4. The resistors R1, R2, R3, and R4 are arranged as a resistor ladder. In some embodiments, the resistor ladder may be the Wheat-Stone ladder.

In some embodiments, as shown in FIG. 2, the resistor R1 is connected between the input terminal Vin1 and the output terminal Vo1. The resistor R2 is connected between the input terminal Vin1 and the output terminal Vo2. The resistor R3 is connected between the input terminal Vin2 and the output terminal Vo1. The resistor R4 is connected between the input terminal Vin2 and the output terminal Vo2. Although a specific number of resistors is illustrated in FIG. 2, it is contemplated that the signal correlated unit 110 may include any number of resistors. For example, one or more resistors may be connected between the input terminal Vin1 and the output terminal Vo1. One or more resistors may be connected between the input terminal Vin1 and the output terminal Vo2. One or more resistors may be connected between the input terminal Vin2 and the output terminal Vo1. One or more connected may be configured between the input terminal Vin2 and the output terminal Vo2.

The resistance of each of the resistors R1, R2, R3, and R4 is not limited, and may be determined according to design requirements. For example, the resistors R1, R2, R3, and R4 may have the same resistance. Alternatively, the resistors R1, R2, R3, and R4 may have different resistances. In some embodiments, the resistance ratio of the resistor R1 to the resistor R3 may be equal to the resistance ratio of the resistor R2 to the resistor R4. The resistance ratio of the resistor R1 to the resistor R3 may be reciprocal to the resistance ratio of the resistor R2 to the resistor R4. In some embodiments, the resistance of the resistor R1 is identical to the resistor R4, and the resistance of the resistor R2 is identical to the resistor R3. In some embodiments, the resistance of the resistor R1 may differ from the resistance of the resistor R3 if the circuit is under the direct current (DC) setting. In some embodiments, the resistance of the resistor R2 may differ from the resistance of the resistor R4 if the circuit is under the DC setting. The resistance of the resistors R1, R2, R3, and R4 are below 1 k$\Omega$. For example, the resistance of the resistors R1, R2, R3, and R4 may be about 100 to 1000. With the resistors having relative small resistance, the area required for the signal correlated unit 110 can be reduced.

Similar to FIG. 1B, an input signal S1 may be applied to the input terminal Vin1. An input signal S2 may be applied to the input terminal Vin2. The signal correlated unit 110 may generate an output signal S11 in response to the input signals S1 and S2. The signal correlated unit 110 may generate an output signal S12 in response to the input signals S1 and S2.

According to the operation of the signal correlated unit 110, the output signal S11 can be calculated with Formula 3:

$$S11 = aS1 + bS2 \qquad [\text{Formula 3}],$$

in which $a$ represents a ratio depending on the resistors R1 and R3; and b represents another ratio depending on the resistors R1 and R3.

According to the operation of the signal correlated unit 110, the output signal S12 can be calculated with Formula 4:

$$S12 = cS1 + dS2 \qquad [\text{Formula 4}],$$

in which c represents a ratio depending on the resistors R2 and R4; and d represents another ratio depending on the resistors R2 and R4.

In some embodiments, according to the configuration of resistors in signal correlated unit 110, the output signals S1 and S12 may be calculated with Formula 5 and 6:

$$S11 = \frac{R_3}{R_1 + R_3} S1 + \frac{R_1}{R_1 + R_3} S2, \qquad [\text{Formula 5}]$$

and $$S12 = \frac{R_4}{R_2 + R_4} S1 + \frac{R_2}{R_2 + R_4} S2, \qquad [\text{Formula 6}]$$

in which $R_1$ is the resistance of the resistor R1; $R_2$ is the resistance of the resistor R2; $R_3$ is the resistance of the resistor R3; and $R_4$ is the resistance of the resistor R4.

According to Formula 5, the output signal S11 is a sum of partial input signal S1 and partial input signal S2. According to Formula 6, the output signal S12 is a sum of partial input signal S1 and partial input signal S2. Therefore, the output signals S11 and S12 are correlated. In some embodiments, the output signals S11 and S12 will be stronger dependent on each other when the resistance of the resistors R1 is substantially close to the resistor R3 thereof, and the resistor R2 is substantially close to the resistor R4 thereof. In other words, the output signals S11 and S12 may be highly correlated when the resistance of the resistors R1, R2, R3, and R4 are substantially close.

The noise may be reduced or eliminated by the signal correlated unit 110. In some embodiments, the input signal S1 may include a signal SS and an input noise ΔS, while the input signal S2 may include a signal SS and an input noise −ΔS. The input noise ΔS can be reduced to an output noise KΔS, where K represents a noise reduction factor. The noise reduction factor K is in a range of 0 to 1. The input signals S1 and S2 can also be calculated using Formulas 7 and 8:

$$S1 = SS + \Delta S \qquad \text{[Formula 7], and}$$

$$S2 = SS - \Delta S \qquad \text{[Formula 8]}.$$

Accordingly, Formula 5 may be calculated as $$S11 = SS + \frac{R_3 - R_1}{R_1 + R_3} \Delta S,$$

and Formula 6 may be calculated as $$S12 = SS + \frac{R_4 - R_2}{R_2 + R_4} \Delta S.$$

In some embodiments, the noise reduction factor K of S11 may be defined as $$\left| \frac{R_3 - R_1}{R_1 + R_3} \right|.$$

The noise reduction factor K of S12 may be defined as $$\left| \frac{R_4 - R_2}{R_2 + R_4} \right|.$$

When the noise reduction factor K is smaller, the correlation between the output signals S11 and S12 is stronger. In some embodiments, the noise reduction factor K may be about 0.1.

The present disclosure may reduce the output noise of the signal correlated unit 110. Input noise of the input signals S1 and S2 may contribute a value 2ΔS of the noise in the differential pair input of the comparator 120 when there is no signal correlated unit 110. With the signal correlated unit 110, the output signals S11 and S12 of the signal correlated unit 110 may have a value KΔS of the output noise, and thus the output signals S11 and S12 may contribute a value 2KΔS of the noise in the differential pair input of the comparator 120. In other words, the input noise of the comparator 120 may be reduced from 2ΔS to 2ΔS. Output signals S11 and S12 may be transmitted to the input terminals VinP and VinN of the comparator 120.

In accordance with the embodiments as shown in FIG. 2, the noise may be reduced or eliminated by using the signal correlated unit 110. In addition, since the signal correlated unit 110 includes the resistor ladder, the area required for the signal correlated unit 110 can be reduced. In addition, the subject disclosure may improve the electromigration (EM) performance. The EM may occur when electrical current runs through a conductive line, wherein the momentum transfer between the conducting electrons and the metal atoms impels metal atoms in the direction of the electron flow, shifting from their original positions and increasing non-uniformity of the conductive line. As time passes, EM generates hillocks (accumulated excess metal) and/or voids (depleted original metal) in the conductive line which may, in turn, result in short circuits (in the presence of hillocks) or open circuits (in the presence of voids). Therefore, it is important to suppress the current from exceeding the current limit of the electromigration. In accordance to the present disclosure, the resistors in the resistor ladder may be metal resistors. A metal resistor has a lower resistance in an integrated circuit, and thus the current limit of the electromigration will increase. Another benefit of the present disclosure is that the reduction factor K is easier to adjust by adjusting the resistance of each resistor in the resistor ladder. In other words, the resistor ladder is a simple circuit for adjusting the reduction factor K.

The noise of the resistors R1, R2, R3, and R4, which also known as the thermal noise or the Johnson-Nyquist noise, is calculated as Formula 9:

$$V_R = \sqrt{\overline{v_n^2} \times \Delta f} \qquad \text{[Formula 9]},$$

in which $V_R$ represents the thermal noise of the resistor; $v_n$ represents a voltage variance (mean square) of the resistor; Δf is the bandwidth in hertz.

The voltage variance (mean square) $v_n$ of the resistor can then be calculated by Formula 10:

$$\overline{v_n^2} = 4kTR \qquad \text{[Formula 10]},$$

in which k represents Boltzmann's constant; T is the resistor's absolute temperature in kelvin degree, and R is the resistance of the resistor in Ω.

In some embodiments, the thermal noise $V_R$ of the resistor is much smaller than the environmental noise of the comparators. For example, the thermal noise $V_R$ of the resistor may be about 1% of the environmental noise of the comparators. Therefore, this circuit may not impact the output noise when reducing the environmental noise of the comparator, since the thermal noise of the circuit is low enough to ignore.

Figure 3:
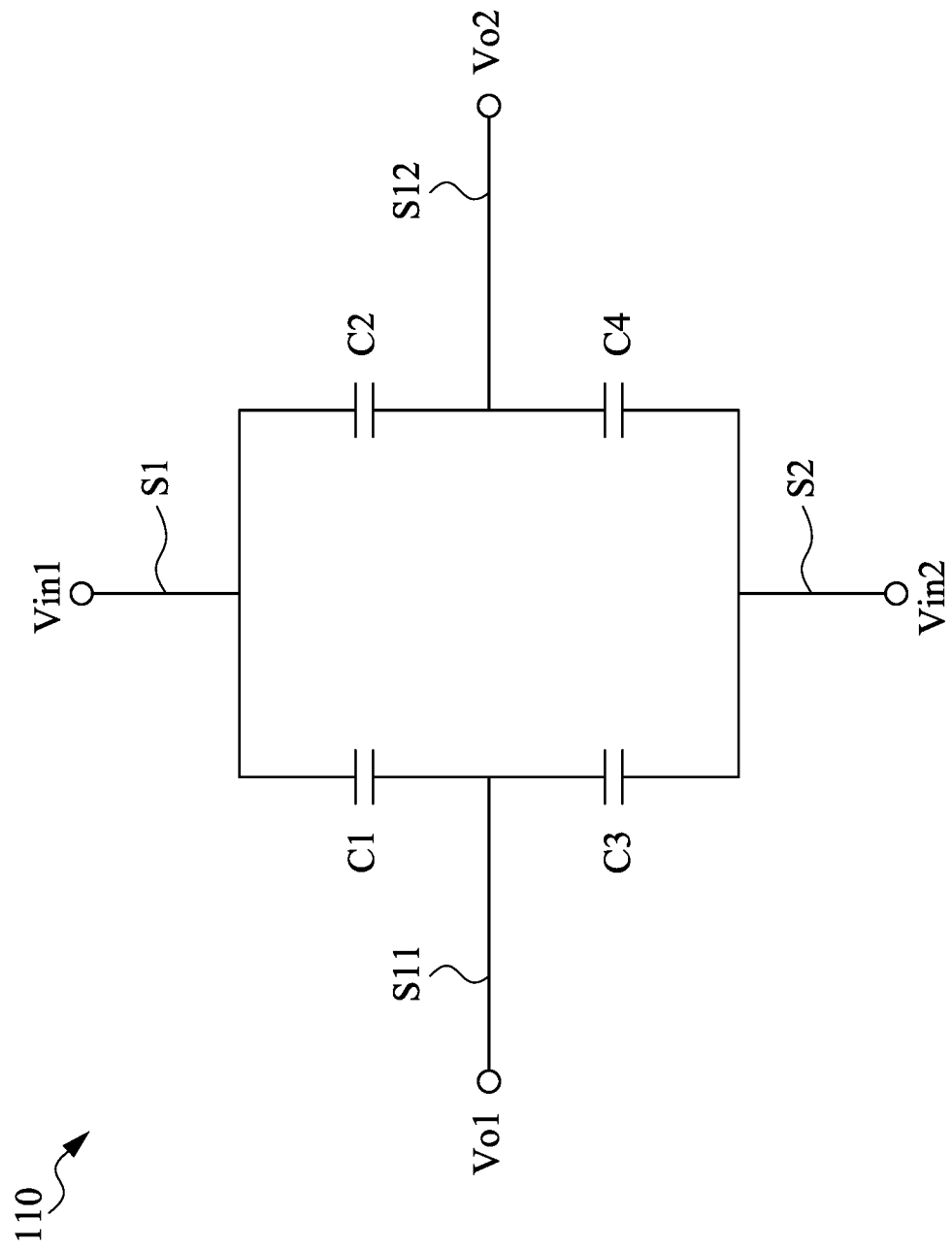
FIG. 3 is a block diagram of the signal correlated unit in accordance with some embodiments of the present disclosure.

FIG. 3 is a block diagram of the signal correlated unit 110 shown in FIGS. 1A and 1B in accordance with some embodiments of the present disclosure. In some embodiments, the signal correlated unit 110 may be a signal correlated circuit. Similar to FIG. 2, FIG. 3 illustrates the signal correlated unit 110, which may include input terminals Vin1 and Vin2, and output terminals Vo1 and Vo2 corresponding to the terminals shown in FIGS. 1A and 1B. In some embodiments, the signal correlated unit 110 may include a plurality of capacitors C1, C2, C3, and C4. The capacitors C1, C2, C3, and C4 are arranged as a capacitor ladder.

In some embodiments, as shown in FIG. 3, the capacitor C1 is connected between the input terminal Vin1 and the output terminal Vo1. The capacitor C2 is connected between the input terminal Vin1 and the output terminal Vo2. The capacitor C3 is connected between the input terminal Vin2 and the output terminal Vo1. The capacitor C4 is connected between the input terminal Vin2 and the output terminal Vo2. Although a specific number of capacitors is illustrated in FIG. 3, it is contemplated that the signal correlated unit 110 may include any number of capacitors. For example, one or more capacitors may be connected between the input terminal Vin1 and the output terminal Vo1. One or more capacitors may be connected between the input terminal Vin1 and the output terminal Vo2. One or more capacitors may be connected between the input terminal Vin2 and the output terminal Vo1. One or more capacitors may be connected between the input terminal Vin2 and the output terminal Vo2.

The impedance of each of the capacitors C1, C2, C3, and C4 is not limited, and may be determined according to design requirements. For example, the capacitors C1, C2, C3, and C4 may have the same impedance. Alternatively, the capacitors C1, C2, C3, and C4 may have different impedances. In some embodiments, the impedance ratio of the capacitor C1 to the capacitor C3 may be equal to the impedance ratio of the capacitor C2 to the capacitor C4. The impedance ratio of the capacitor C1 to the capacitor C3 may be reciprocal to the impedance ratio of the capacitor C2 to the capacitor C4. In some embodiments, the impedance of the capacitor C1 is identical to the capacitor C4, and the impedance of the capacitor C2 is identical to the capacitor C3. In some embodiments, the impedance of the capacitor C1 may differ from the impedance of the capacitor C3 when the circuit is under DC setting. In some embodiments, the impedance of the capacitor C2 may differ from the impedance of the capacitor C4 when the circuit is under DC setting.

Similar to FIG. 2, an input signal S1 may be applied to the input terminal Vin1. An input signal S2 may be applied to the input terminal Vin2. The signal correlated unit 110 may generate an output signal S11 in response to the input signals S1 and S2. The signal correlated unit 110 may generate an output signal S12 in response to the input signals S1 and S2.

According to the operation of the signal correlated unit 110, the output signal S11 can be calculated with Formula 11:

$$S11 = eS1 + fS2 \quad \text{[Formula 11]},$$

in which e represents an impedance ratio depending on the capacitors C1 and C3; and f represents another impedance ratio depending on the capacitors C1 and C3.

According to the operation of the signal correlated unit 110, the output signal S12 can be calculated with Formula 12:

$$S12 = gS1 + hS2 \quad \text{[Formula 12]},$$

in which g represents an impedance ratio depending on the capacitors C2 and C4; and h represents another ratio depending on the capacitors C2 and C4.

In some embodiments, according to the configuration of capacitors in signal correlated unit 110, the output signals S11 and S12 may be calculated with Formula 13 and 14:

$$S11 = \frac{Z_{C3}}{Z_{C1} + Z_{C3}} S1 + \frac{Z_{C1}}{Z_{C1} + Z_{C3}} S2, \quad \text{[Formula 13]}$$

$$S12 = \frac{Z_{C4}}{Z_{C2} + Z_{C4}} S1 + \frac{Z_{C2}}{Z_{C2} + Z_{C4}} S2, \quad \text{[Formula 14]}$$

in which $Z_{c1}$ is the impedance of the capacitor C1; $Z_{c2}$ is the impedance of the capacitor C2; $Z_{c3}$ is the impedance of the capacitor C3; and $Z_{c4}$ is the impedance of the capacitor C4.

According to Formula 13, the output signal S11 is a sum of partial input signal S1 and partial input signal S2. According to Formula 14, the output signal S12 is a sum of partial input signal S1 and partial input signal S2. Therefore, the output signals S11 and S12 are correlated. In some embodiments, the output signals S11 and S12 will be stronger dependent on each other when the impedance of the capacitors C1 is substantially close to the capacitor C3 thereof, and the impedance of the capacitor C2 is substantially close to the capacitor C4 thereof. In other words, the output signals S11 and S12 may be highly correlated when the impedance of the capacitors C1, C2, C3, and C4 are substantially close.

The noise may be reduced or eliminated by the signal correlated unit 110. In some embodiment, the input signal S1 may include a signal SS and an input noise ΔS, while the input signal S2 may include a signal SS and an input noise −ΔS. The input noise ΔS can be reduced to an output noise KΔS, where K represents a noise reduction factor. The noise reduction factor K is in a range of 0 to 1. The input signals S1 and S2 can also be calculated using Formulas 7 and 8 as the description above). Accordingly, Formula 13 may be calculated as $$S11 = SS + \frac{Z_{C3} - Z_{C1}}{Z_{C1} + Z_{C3}} \Delta S,$$

and Formula 14 may be calculated as $$S12 = SS + \frac{Z_{C4} - Z_{C2}}{Z_{C2} + Z_{C4}} \Delta S.$$

In some embodiments, the noise reduction factor K of S11 may be defined as $$\left| \frac{Z_{C3} - Z_{C1}}{Z_{C1} + Z_{C3}} \right|.$$

The noise reduction factor K of S12 may be defined as $$\left| \frac{Z_{C4} - Z_{C2}}{Z_{C2} + Z_{C4}} \right|.$$

When the noise reduction factor K is smaller, the correlation between the output signals S11 and S12 is stronger. In some embodiments, the noise reduction factor K may be about 0.1.

The present disclosure may reduce the output noise of the signal correlated unit 110. Input noise of the input signals S1 and S2 may contribute a value 2ΔS of the noise in the differential pair input of the comparator 120 when there is no signal correlated unit 110. With the signal correlated unit 110, the output signals S11 and S12 of the signal correlated unit 110 may have a value KΔS of the output noise, and thus the output signals S11 and S12 may contribute a value 2KΔS of the noise in the differential pair input of the comparator 120. In other words, the input noise of the comparator 120 may be reduced from 2ΔV to 2KΔV. Output signals S11 and S12 may be transmitted to the input terminals VinP and VinN of the comparator 120. In accordance with the embodiments as shown in FIG. 3, the noise may be reduced or eliminated by using the signal correlated unit 110.

Figure 4:
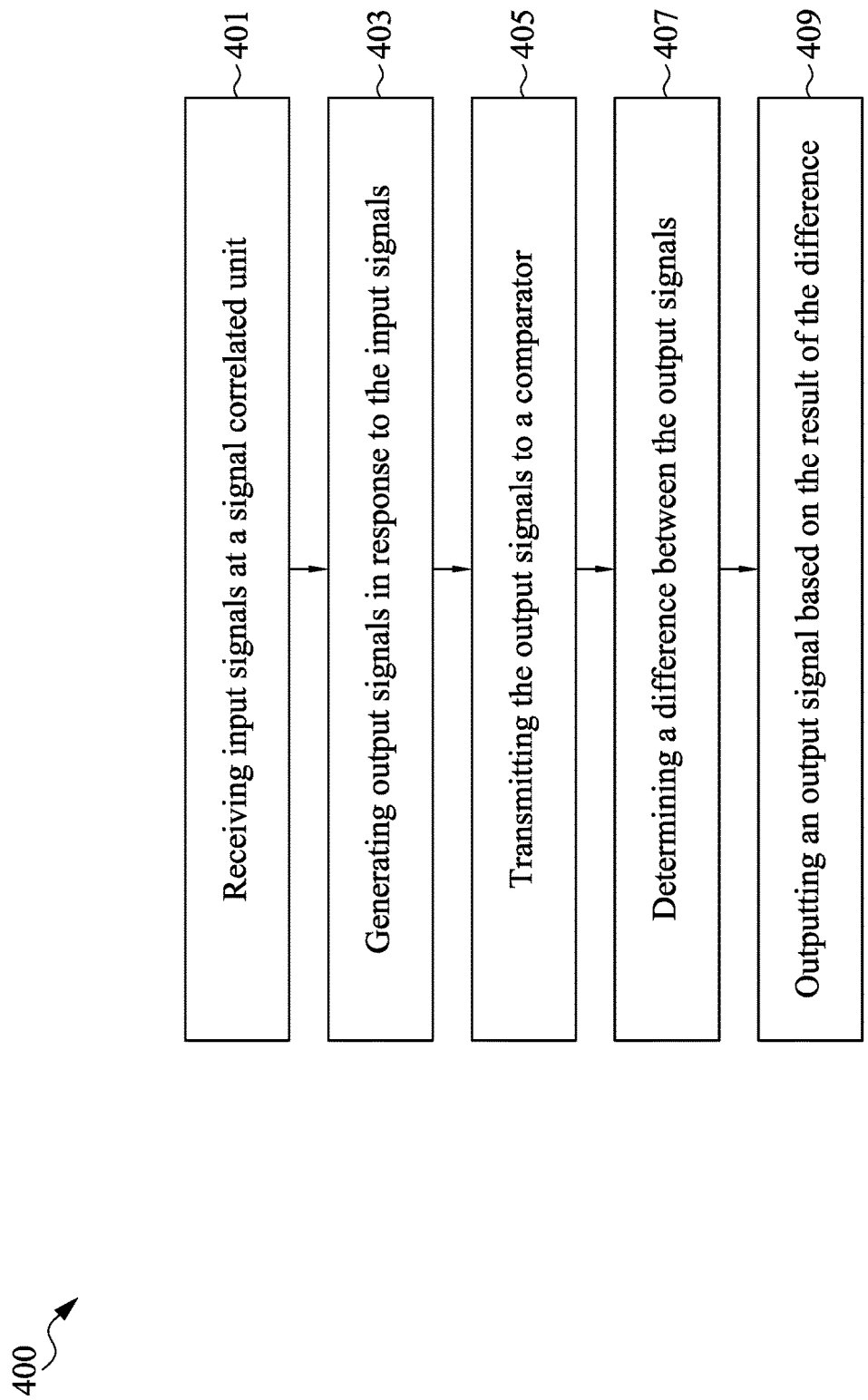
FIG. 4 illustrates a flow chart of a method for operating the signal correlated unit and the comparator in accordance with some embodiments of the present disclosure.

FIG. 4 illustrates a flow chart of an exemplary method showing the operation process of the signal correlated unit 110 and the comparator 120 in accordance with some embodiments of the present disclosure. The method 400 shown in FIG. 4 may be operated by the system 15 shown in FIGS. 1A and 1B.

In some embodiments, the operations of the signal correlating method of FIG. 4 may be carried out by the signal correlated unit 110 and the comparator 120 of FIGS. 1A and 1B. However, the present disclosure is not limited thereto. In some embodiments, the signal correlating method of the present disclosure may be applied to any suitable integrated circuit, which includes at least a comparator.

The signal correlating method 400 as shown in FIG. 4 may begin in operation 401, receiving an input signal S1 and an input signal S2 at a signal correlated unit 110, where the first signal S1 is independent from the second signal S2. In some embodiments, the input signal S1 may be received at the input terminal Vin1 of the signal correlated unit 110, and the input signal S2 may be received at the input terminal Vin2 of the signal correlated unit 110. The input signals S1 and S2 may include environmental noise. In some embodiments, the environmental noise in the input signal S1 may be generated by any devices or circuits coupled to the input terminal Vin1. Similarly, the environmental noise in the input signal S2 may be generated by any devices or circuits coupled to the input terminal Vin2.

In operation 403, the signal correlated unit 110 generates output signals S11 and S12 in response to the input signals S1 and S2. In some embodiments, the output signal S11 is formed by partial of the input signal S1 and partial of the input signal S2. The output signal S12 is also formed by partial of the input signal S1 and partial of the input signal S2. Therefore, the output signals S11 and S12 are correlated.

In some embodiments, the signal correlated unit 110 may have a resistor ladder as shown in FIG. 2. With resistors R1, R2, R3, and R4 coupled between the terminals of the signal correlated unit 110, the output signal S11 may be formed by the input signals S1 and S2, which may be expressed as:

$$S11 = \frac{R_3}{R_1 + R_3}S1 + \frac{R_1}{R_1 + R_3}S2.$$

Likewise, the output signal S12 may be formed by the input signals S1 and S2, which may be expressed as:

$$S12 = \frac{R_4}{R_2 + R_4}S1 + \frac{R_2}{R_2 + R_4}S2.$$

The output signals S11 and S12 are both formed by the input signals S1 and S2. Therefore, the output signals S11 and S12 are correlated according to the circuit configuration of some embodiments shown in FIG. 2.

The signal correlated unit 110 may reduce the noise as well. For example, the input signal S1 may include a signal SS and an input noise $\Delta S$, while the input signal S2 may include a signal SS and a negative input noise $\Delta S$.

Accordingly, the output signal S11 may be calculated to $$S11 = SS + \frac{R_3 - R_1}{R_1 + R_3}\Delta S,$$

and the output signal S12 may be calculated to $$S12 = SS + \frac{R_4 - R_2}{R_2 + R_4}\Delta S.$$

In other words, the input noise $\Delta S$ could be reduced to an output noise K$\Delta S$, where K represents a noise reduction factor. Wherein the noise reduction factor K is in a range of 0 to 1. In some embodiments, the noise reduction factor K of S11 may be defined as $$\left|\frac{R_3 - R_1}{R_1 + R_3}\right|.$$

The noise reduction factor K of S12 may be defined as $$\left|\frac{R_4 - R_2}{R_2 + R_4}\right|.$$

When the noise reduction factor K is smaller, the correlation between the output signals S11 and S12 would be stronger. In some embodiments, the noise reduction factor K may be about 0.1.

In operation 405, the correlated output signals S11 and S12 generated by the signal correlated unit 110 are transmitted to the comparator 120. In some embodiments, the output terminal Vo1 of the signal correlated unit 110 is coupled to the input terminal VinP of the comparator 120 to transmit the output signal S11. The output terminal Vo2 of the signal correlated unit 110 is coupled to the input terminal VinN of the comparator 120 to transmit the output signal S12.

In operation 407, the comparator determines a difference between the signals S11 and S12. In some embodiments, the signal difference may be voltage level (or current level).

In operation 409, the comparator outputs an output signal Sout at the output terminal Vout based on the result of the comparison between the signals S11 and S12. If the difference is positive, the comparator 120 may output a logic high output signal at the output terminal Vout of the comparator 120. If the difference is negative, the comparator 120 may output a logic low output signal at the output terminal Vout of the comparator 120.

In some embodiments, due to the signal correlated unit 110, the noise of the signals S11 and S12 may be reduce from $\Delta S$ to K$\Delta S$. Consequently, the output noise of the comparator 120 may be reduced from 2$\Delta S$ to 2K$\Delta S$ in the differential pair input of the comparator 120.

With the correlated signals S11 and S12, the noise of the signals S11 and S12 may also be correlated. The noise may be removed through a differential pair of the comparator 120 when a strong correlation exists between the correlated noises.

When the signals S11 and S12 are strong correlated in response to the signals S1 and S2, the noise of the signals S1 and S2 may be substantially identical with the covariance, which could be expressed as $(\sigma_{v1}^2 + \sigma_{v2}^2) \cong 2\,\text{cov}(v1, v2)$. Therefore, the comparator 120 may remove the input-referred noise by a differential comparison, when there is a strong correlation between the signals S11 and S12 received at the input terminals VinP and VinN of the comparator 120.

In some embodiments, the present disclosure provides a circuitry. The circuitry includes a comparator and a signal correlated circuit. The comparator includes a first input terminal, a second input terminal, and an output terminal. The signal correlated circuit includes a first input terminal, a second input terminal, a first output terminal, and a second output terminal. The first input terminal is coupled to receive a first input signal. The second input terminal is coupled to receive a second input signal independent from the first input signal. The first output terminal is configured to generate a first output signal and to send the first output signal to the first input terminal of the comparator. The second output terminal is configured to generate a second output signal and to send the second output signal to the second input terminal of the comparator. The first output signal and the second output signal are correlated with each other.

In some embodiments, the present disclosure provides a circuitry. The circuitry includes a comparator and a signal correlated circuit. The comparator includes a first input terminal, a second input terminal, and an output terminal. The signal correlated circuit includes a first input terminal, a second input terminal, a first output terminal, and a second output terminal. The first input terminal is coupled to receive a first input signal. The second input terminal is coupled to receive a second input signal independent from the first input signal. The first output terminal is configured to generate a first output signal and to send the first output signal to the first input terminal of the comparator. The second output terminal is configured to generate a second output signal and to send the second output signal to the second input terminal of the comparator. The first output signal is correlated to the first input signal and the second input signal, and the second output signal is correlated to the first input signal and the second input signal.

In some embodiments, the present disclosure provides a method for correlating signals. The method includes receiving, by a signal correlated unit, a first signal and a second signal; generating, by the signal correlated unit, a third signal and a fourth signal in response to the first signal and the second signal; transmitting, by the signal correlated unit, the third signal and the fourth signal to a comparator; determining, by the comparator, a difference between the third signal and the fourth signal; and outputting, by the comparator, an output signal based on the result of the difference. The first signal is independent from the second signal. The third signal and the fourth signal are formed by partial of the first signal and the second signal. The noise of the third signal is K times the noise of the first signal, and the K is in a range of 0 to 1.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A circuitry, comprising:
   a comparator, comprising a first input terminal, a second input terminal, and an output terminal;
   a signal correlated circuit, comprising:
     a first input terminal coupled to receive a first input signal;
     a second input terminal coupled to receive a second input signal independent from the first input signal;
     a first output terminal configured to generate a first output signal and to send the first output signal to the first input terminal of the comparator; and
     a second output terminal configured to generate a second output signal and to send the second output signal to the second input terminal of the comparator;
   a first digital-to-analog converter (DAC) coupled to the first input terminal of the signal correlated circuit, wherein the first DAC is configured to convert a first digital signal into the first input signal and transmit the first input signal to the first input terminal of the signal correlated circuit; and
   a second DAC coupled to the second input terminal of the signal correlated circuit, wherein the second DAC is configured to convert a second digital signal into the second input signal and transmit the second input signal to the second input terminal of the signal correlated circuit,
   wherein the first output signal and the second output signal are correlated with each other.

2. The circuitry of claim 1, wherein the first output signal is correlated to the first input signal and the second input signal, and the second output signal is correlated to the first input signal and the second input signal, wherein the first output signal includes a first noise signal and the second output signal includes a second noise signal, and wherein the comparator is configured to remove the first noise signal and the second noise signal by a differential comparing.

3. The circuitry of claim 1, wherein the comparator has a resolution being micro-voltage level.

4. The circuitry of claim 1, wherein the signal correlated circuit including:
   a first resistor connected between the first input terminal and the first output terminal;
   a second resistor connected between the first input terminal and the second output terminal;
   a third resistor connected between the second input terminal and the first output terminal; and
   a fourth resistor connected between the second input terminal and the second output terminal.

5. The circuitry of claim 4, wherein a resistance of the first resistor is identical to the fourth resistor, and a resistance of the second resistor is identical to the third resistor.

6. The circuitry of claim 5, wherein the resistance of the first resistor, the second resistor, the third resistor, and the fourth resistor is in a range of 10 to 100 Ohms.

7. The circuitry of claim 1, wherein the first output signal includes a noise signal, which is K times a noise signal of the first input signal, wherein the K is in a range of 0 to 1.

8. The circuitry of claim 1, further comprising:
   a field programmable gate array (FPGA) board connected to the first DAC and the second DAC, and configured to generate the first digital signal transmitted to the first DAC and the second digital signal transmitted to the second DAC.

9. The circuitry of claim 1, wherein the signal correlated circuit including:
a first capacitor connected between the first input terminal and the first output terminal;
a second capacitor connected between the first input terminal and the second output terminal;
a third capacitor connected between the second input terminal and the first output terminal; and
a fourth capacitor connected between the second input terminal and the second output terminal.

10. The circuitry of claim 9, wherein a capacitance of the first capacitor is identical to the fourth capacitor, and a capacitance of the second capacitor is identical to the third capacitor.

11. A circuitry, comprising:
a comparator, comprising a first input terminal, a second input terminal, and an output terminal;
a signal correlated circuit, comprising:
  a first input terminal coupled to receive a first input signal;
  a second input terminal coupled to receive a second input signal independent from the first input signal;
  a first output terminal configured to generate a first output signal and to send the first output signal to the first input terminal of the comparator; and
  a second output terminal configured to generate a second output signal and to send the second output signal to the second input terminal of the comparator,
a first digital-to-analog converter (DAC) coupled to the first input terminal of the signal correlated circuit, wherein the first DAC is configured to convert a first digital signal into the first input signal and transmit the first input signal to the first input terminal of the signal correlated circuit; and
a second DAC coupled to the second input terminal of the signal correlated circuit, wherein the second DAC is configured to convert a second digital signal into the second input signal and transmit the second input signal to the second input terminal of the signal correlated circuit,
wherein the first output signal is correlated to the first input signal and the second input signal, and the second output signal is correlated to the first input signal and the second input signal.

12. The circuitry of claim 11, wherein the first output signal is a sum of a first part of the first input signal and a second part of the second input signal, and the second output signal is a sum of a third part of the first input signal and a fourth part of the second input signal.

13. The circuitry of claim 11, wherein the signal correlated circuit comprising:
a first resistor configured between the first input terminal and the first output terminal;
a second resistor configured between the first input terminal and the second output terminal;
a third resistor configured between the second input terminal and the first output terminal; and
a fourth resistor configured between the second input terminal and the second output terminal.

14. The circuitry of claim 13, wherein a resistance of first resistor is identical to fourth resistor thereof, and a resistance of second resistor is identical to third resistor thereof.

15. The circuitry of claim 13, wherein a resistance of the first resistor, the second resistor, the third resistor, and the fourth resistor is about 10 to 100 Ohms.

16. The circuitry of claim 11, wherein the first output signal includes a noise signal, which is K times a noise signal of the first input signal, wherein the K is about 0.1.

17. A method, comprising:
receiving, by a first digital-to-analog converter (DAC), a first digital signal and converting the first digital signal into a first signal;
receiving, by a second DAC, a second digital signal and converting the second digital signal into a second signal;
receiving, by a signal correlated unit, h first signal from the first DAC and h second signal from the second DAC, wherein the first signal is independent from the second signal;
generating, by the signal correlated unit, a third signal and a fourth signal in response to the first signal and the second signal, wherein the third signal and the fourth signal are formed by partial of the first signal and the second signal;
transmitting, by the signal correlated unit, the third signal and the fourth signal to a comparator;
determining, by the comparator, a difference between the third signal and the fourth signal; and
outputting, by the comparator, an output signal based on the result of the difference;
wherein the noise of the third signal is K times the noise of the first signal, and the K is in a range of 0 to 1.

18. The method of claim 17, wherein the K is about 0.1.

19. The method of claim 17, wherein the signal correlated unit comprising:
a first resistor configured between the first input terminal and the first output terminal;
a second resistor configured between the first input terminal and the second output terminal;
a third resistor configured between the second input terminal and the first output terminal; and
a fourth resistor configured between the second input terminal and the second output terminal.

20. The method of claim 19, wherein a resistance of the first resistor is identical to the fourth resistor thereof, and a resistance of the second resistor is identical to the third resistor thereof.

* * * * *